United States Patent
Inoue et al.

(10) Patent No.: US 7,802,218 B2
(45) Date of Patent: Sep. 21, 2010

(54) LAYOUT ANALYSIS METHOD AND APPARATUS FOR SEMICONDUCTOR INTEGRATED CIRCUIT

(75) Inventors: Yoshio Inoue, Kasugai (JP); Takashi Yoneda, Kasugai (JP); Masaru Ito, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/396,660

(22) Filed: Apr. 4, 2006

(65) Prior Publication Data
US 2007/0106967 A1    May 10, 2007

(30) Foreign Application Priority Data
Nov. 8, 2005    (JP)    ............... 2005-323807

(51) Int. Cl.
*G06F 9/45* (2006.01)
*G06F 17/50* (2006.01)

(52) U.S. Cl. ............... 716/10; 716/4; 716/19; 716/20; 716/21; 430/5; 430/30

(58) Field of Classification Search ............... 716/10, 716/19, 20, 21, 4; 430/5, 30
See application file for complete search history.

(56) References Cited

U.S. PATENT DOCUMENTS

| | | | | |
|---|---|---|---|---|
| 5,657,284 A | * | 8/1997 | Beffa | 365/201 |
| 5,889,312 A | * | 3/1999 | Miura et al. | 257/420 |
| 5,994,758 A | | 11/1999 | Hayashi | |
| 2003/0229881 A1 | * | 12/2003 | White et al. | 716/19 |
| 2004/0060033 A1 | * | 3/2004 | Kamon | 716/19 |
| 2005/0235246 A1 | * | 10/2005 | Smith et al. | 716/21 |

FOREIGN PATENT DOCUMENTS

| | | |
|---|---|---|
| JP | 63-293970 | 11/1988 |
| JP | 10-189875 | 7/1998 |
| JP | 2002-318829 | 10/2002 |
| JP | 2004-258836 | 9/2004 |

OTHER PUBLICATIONS

"A yield and speed enhancement scheme under within-die variations on 90nm LUT array", by Kazuya Katsuki, Manabu Kotani, Kazutoshi Kobayashi, and Hidetoshi Onodera, @Sep. 21, 2005 by IEEE.*

* cited by examiner

*Primary Examiner*—Paul Dinh
*Assistant Examiner*—Nha T Nguyen
(74) *Attorney, Agent, or Firm*—Staas & Halsey LLP

(57) ABSTRACT

A method for analyzing a layout for a semiconductor integrated circuit, which includes a plurality of physical devices, to generate physical parameter distribution enabling accurate recognition of changes in transistor characteristics caused by systematic variations. The method includes holding systematic variation tables for physical parameters dependent on the layout of the semiconductor integrated circuit among physical parameters related to characteristics of the semiconductor integrated circuit, analyzing a design layout pattern of the semiconductor integrated circuit and selecting tables corresponding to the plurality of physical devices, and generating a physical parameter distribution based on the selected tables.

8 Claims, 7 Drawing Sheets

Shape 1
Low Density 1
Area 1

Shape 2
High Density 1
Area 1

Shape 1
Low Density 2
Area 2

Shape 2
High Density 2
Area 2

LAYOUT ANALYSIS METHOD AND APPARATUS FOR SEMICONDUCTOR INTEGRATED CIRCUIT

CROSS-REFERENCE TO RELATED APPLICATIONS

This application is based upon and claims the benefit of priority from prior Japanese Patent Application No. 2005-323807, filed on Nov. 8, 2005, the entire contents of which are incorporated herein by reference.

BACKGROUND OF THE INVENTION

The present invention relates to a layout analysis method and apparatus for analyzing systematic variations in a semiconductor integrated circuit and generating a physical parameter distribution that depends on the layout.

Large-scale integrated circuits (LSIs) have increasingly been miniaturized in recent years. For such miniaturized LSIs, variations in layout patterns and arrangements of circuit elements or variations in manufacturing processes greatly affect circuit performance. Systematic variations (variations for which cause can be identified using design data) cannot be distinguished from random variations (variations for which cause cannot be identified using design data) in present LSI design environments. Thus, circuits employ worst-case designs, which take into consideration all possible variations and include excessive margins for overcoming the worst conditions. In recent years, LSIs are required to operate at a lower voltage to reduce power consumption and operate at higher speeds. However, circuits with excessive margins hinder reduction in power consumption and increase in operation speed. Moreover, it is difficult to provide sufficient margins. To enable circuit designing with reduced margins, it is necessary to analyze systematic variations for a semiconductor integrated circuit and generate a physical parameter distribution that depends on the layout.

FIG. 1 shows a transistor layout on a chip 1. The transistor is formed with poly gates 3 and diffusion regions 2. In a miniaturized LSI, transistor characteristics change greatly in accordance with differences in transistor pattern shapes and density (interval) and positions of poly gates.

For example, the intervals of the poly gates 3 differ between transistors formed in areas a, b, and c. This is the same in areas d, e, and f. The transistors formed in areas a and d have the same pattern. However, since the transistors in areas a and d are located at different positions and arranged in different orientations, the transistor characteristics in area a and area d are different.

Under present designing environments, there are no analyzing means or processes for locating causes of processing variations. Thus, characteristics, such as delay time, power consumption, and leakage current, are analyzed using transistor characteristics under the worst condition (worst point) and best condition (best point) as parameters for characteristic analysis.

SUMMARY OF THE INVENTION

In the above example of the prior art, only the transistor characteristics at the worst point and the best point are used as characteristic analysis parameters when designing a semiconductor integrated circuit. Accordingly, designing must be performed with sufficient margins based on the transistor characteristics at the worst point and the best point. However, recent LSIs operate at higher speeds and lower voltages to reduce power consumption. Thus, designing that provides excessive margins hinder reduction in further reduction in power consumption and further increase in operation speeds.

Japanese Laid-Open Patent Publication No. 2002-318829 describes a method for easily conducting a circuit simulation, which takes into consideration variations, with high accuracy. In this circuit simulation, variations in layout patterns and arrangements are represented by expressions. Parameters for the expressions are stored as a device parameter group associated with devices. The parameters in the device parameter group are varied to conduct a simulation.

However, since the parameters for the expressions are stored as a device parameter group associated with devices, the simulation does not completely conform to the actual variations.

The present invention provides a layout analysis method and layout analysis apparatus for generating physical parameter distribution enabling accurate recognition of changes in transistor characteristics caused by systematic variations through simulations by improving the analysis accuracy of transistor characteristics.

One aspect of the present invention is a method for analyzing a layout for a semiconductor integrated circuit including a plurality of physical devices. The method includes holding systematic variation tables for physical parameters dependent on the layout of the semiconductor integrated circuit among physical parameters related to characteristics of the semiconductor integrated circuit, analyzing a design layout pattern for the semiconductor integrated circuit and selecting tables corresponding to the plurality of physical devices, and generating a physical parameter distribution based on the selected tables.

Another aspect of the present invention relates to a method for analyzing a layout for a semiconductor integrated circuit including a plurality of physical devices. The method includes holding systematic variation tables for physical parameters dependent on the layout and assembly stress of the semiconductor integrated circuit among physical parameters related to characteristics of the semiconductor integrated circuit, analyzing a design layout pattern for the semiconductor integrated circuit and selecting tables corresponding to the plurality of physical devices, and generating a physical parameter distribution based on the selected tables.

A further aspect of the present invention is a method for analyzing a layout for a semiconductor integrated circuit including a plurality of physical devices. The method includes holding systematic variation tables for physical parameters dependent on the layout and process stress of the semiconductor integrated circuit among physical parameters related to characteristics of the semiconductor integrated circuit, analyzing a design layout pattern for the semiconductor integrated circuit and selecting tables corresponding to the plurality of physical devices, and generating a physical parameter distribution based on the selected tables.

Another aspect of the present invention is a layout analysis apparatus for analyzing a layout for a semiconductor integrated circuit including a plurality of physical devices. The apparatus includes a library for holding systematic variation tables for physical parameters dependent on the layout of the semiconductor integrated circuit among physical parameters related to characteristics of the semiconductor integrated circuit. An analyzer analyzes a design layout pattern for the semiconductor integrated circuit, selects and extracts tables corresponding to the plurality of physical devices, and generates and extracts a physical parameter distribution based on the extracted tables.

A further aspect of the present invention is a layout analysis apparatus for analyzing a layout for a semiconductor integrated circuit including a plurality of physical devices. The apparatus includes a library for holding systematic variation tables for physical parameters dependent on the layout and assembly stress of the semiconductor integrated circuit among physical parameters related to characteristics of the semiconductor integrated circuit. An analyzer analyzes a design layout pattern for the semiconductor integrated circuit, selects and extracts tables corresponding to the plurality of physical devices, and generates a physical parameter distribution based on the extracted tables.

Another aspect of the present invention is a layout analysis apparatus for analyzing a layout for a semiconductor integrated circuit including a plurality of physical devices. The apparatus includes a library for holding systematic variation tables for physical parameters dependent on the layout and process stress of the semiconductor integrated circuit among physical parameters related with characteristics of the semiconductor integrated circuit. An analyzer analyzes a design layout pattern for the semiconductor integrated circuit, selects and extracts tables corresponding to the plurality of physical devices, and generates a physical parameter distribution based on the extracted tables.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
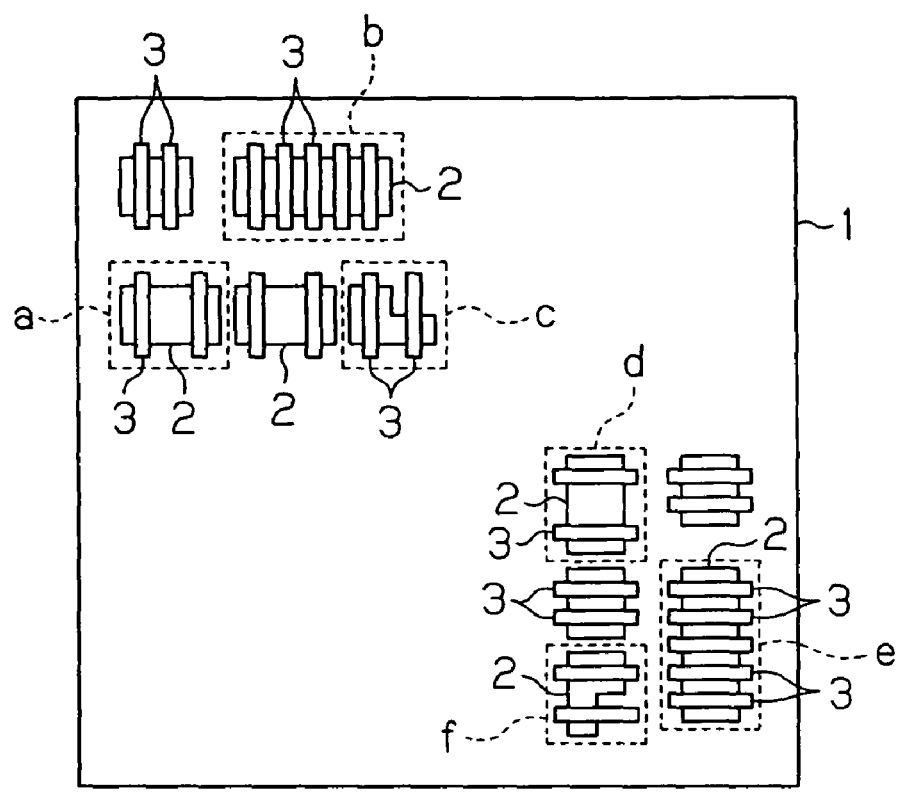
FIG. 1 is a schematic diagram showing a layout on a chip.
Figure 2:
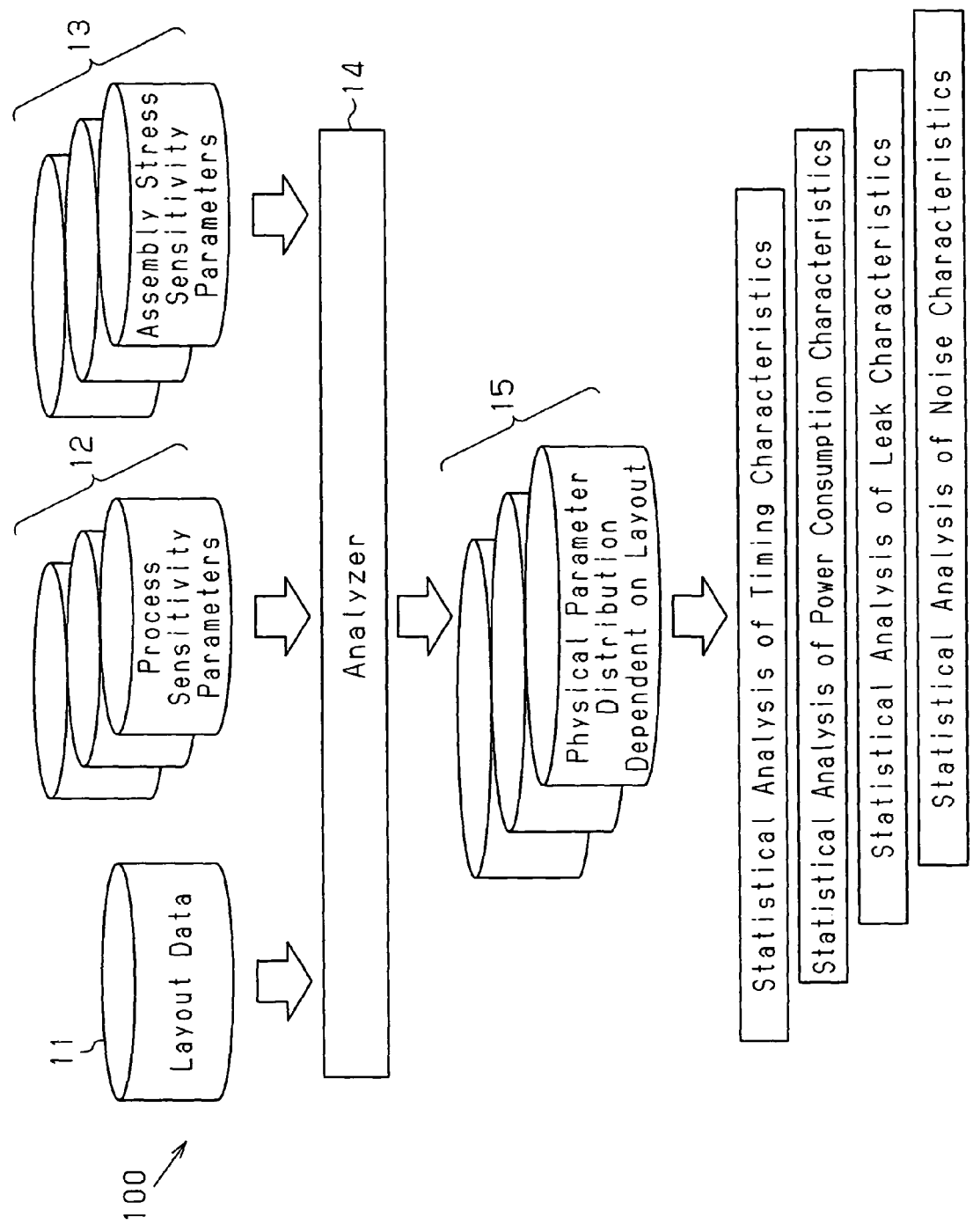
FIG. 2 is a block diagram of a layout analysis apparatus according to a preferred embodiment of the present invention.

A layout analysis method and apparatus for a semiconductor integrated circuit according to a preferred embodiment of the present invention will now be discussed. FIG. 2 shows a layout analysis apparatus 100. The layout analysis apparatus 100 includes a first library 11, a second library 12, a third library 13, and an analyzer 14.

The first library 11 stores layout pattern data, which is generated beforehand. In the preferred embodiment, the first library 11 stores layout patterns of cells or macros laid out for each chip or macro.

The second library 12 stores various types of process sensitivity parameters. The third library 13 stores various types of assembly stress sensitivity parameters.

The process sensitivity parameters stored in the second library 12 are tables associated with systematic factors that are dependent on the layout of the semiconductor integrated circuit, such as the pattern shapes of physical devices like transistors, the density (intervals) of patterns, and the location of patterns on the chip. These tables are distribution tables for various types of parameters that vary transistor characteristics, such as the delay time, noise characteristic, leakage current, and power consumption. As for transistors, the parameters includes the gate length, gate width, gate oxide film thickness, threshold, diffusion resistance, and wire resistance. As for wires, the parameters include wire thickness, wire width, interlayer film thickness, dielectric constant, and resistance.

The assembly stress sensitivity parameters stored in the third library 13 are tables associated with systematic factors that are dependent on stress produced in an assembly process. These tables are distribution tables for various types of parameters that vary transistor characteristics, such as the delay time, noise characteristic, leakage current, and power consumption.

Figure 3:
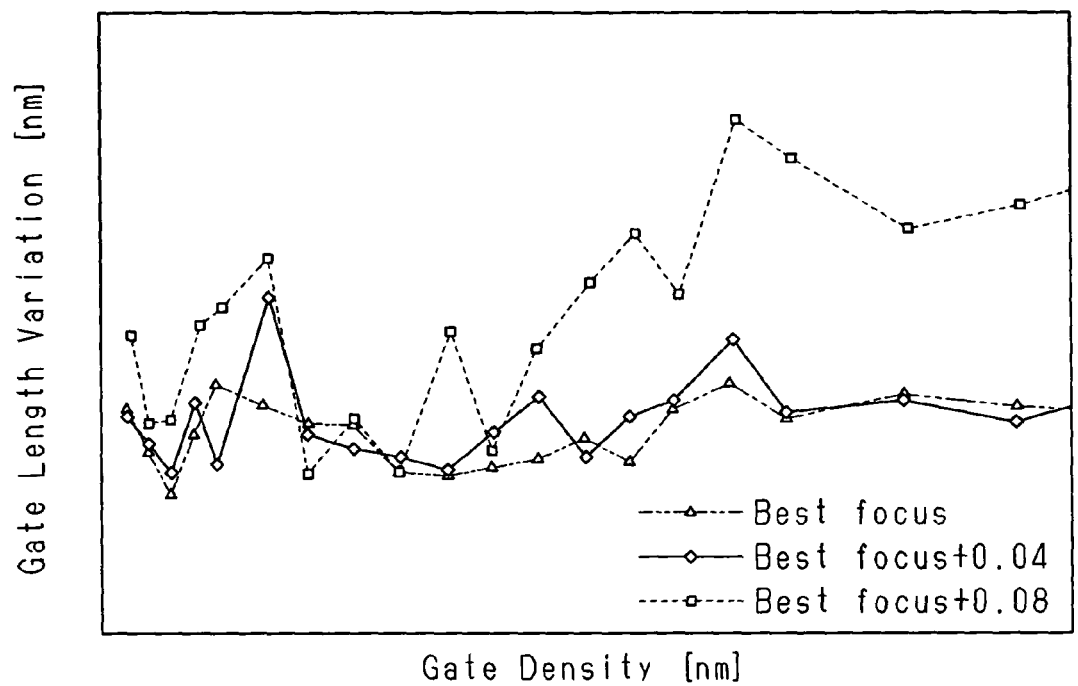
FIG. 3 is a diagram showing one example of a graph.

FIG. 3 shows an example of a graph representing a table stored in the second library 12. The table illustrates gate length variations that are dependent on the density (intervals) of the poly gates. FIG. 3 shows variations in the gate length that are dependent on the intervals between poly gates. The variations in the gate length were measured through experiments conducted under a plurality of exposure conditions, and the measured values were each stored as a table in second library.

As for the other various types of tables, measured values obtained in the same manner through experiments are stored as tables in the second library 12 or the third library 13.

The analyzer 14 is formed by a computer-aided design (CAD) device and analyzes the layout patterns stored in the first library 11. The analyzer 14 selects a table from the second library 12 and the third library 13. For example, the analyzer 14 selects a table for a sensitivity parameter associated with transistors. Based on the selected table, the analyzer 14 generates a physical parameter distribution that is dependent on the layout or a physical parameter distribution that is dependent on assembly stress and stores the physical parameter distribution in a fourth library 15.

Figure 4:
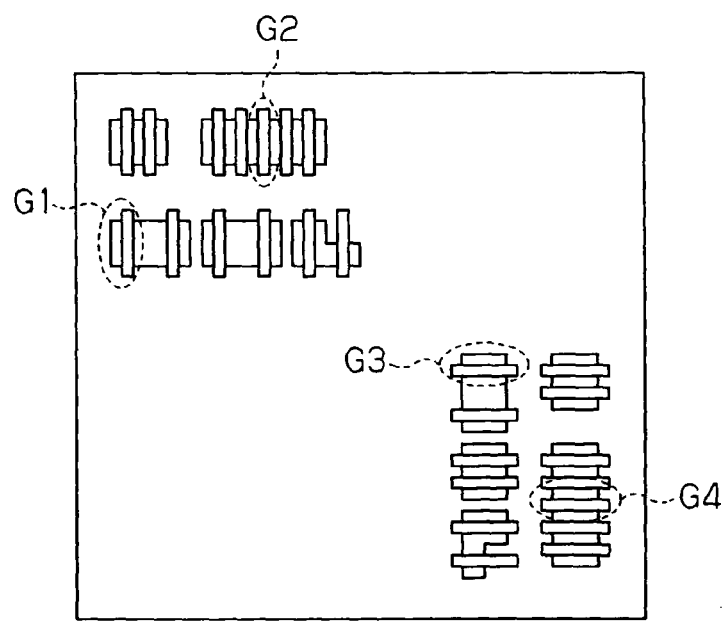
FIG. 4 is a schematic diagram showing a layout on a chip.
Figure 5A:
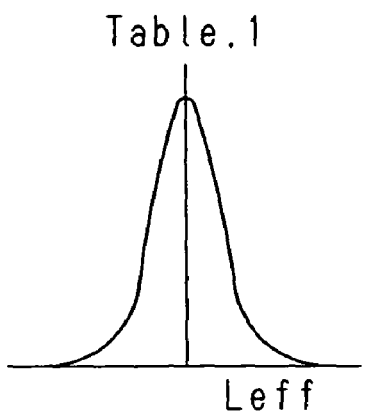
FIGS. 5A to 5D are distribution models that are stored as graphs.
Figure 5B:
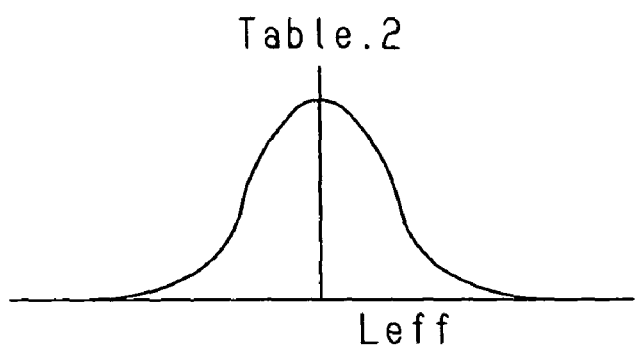
Figure 5C:
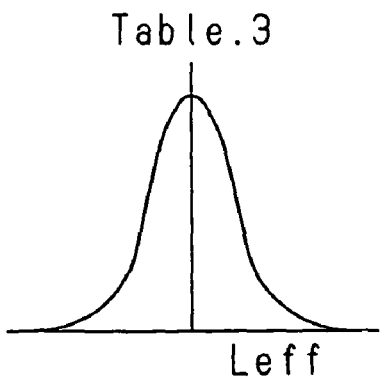
Figure 5D:
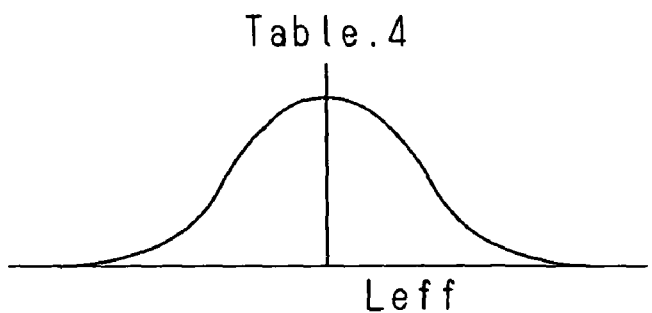

FIG. 4 shows an example of a layout pattern stored in the first library 11. A plurality of transistors are laid out on a chip. When generating a poly gate physical parameter distribution that is dependent on the layout pattern, the analyzer 14 analyzes the layout pattern. For example, the analyzer 14 analyzes the pattern shapes, the density, and locations of the poly gates G1 to G4.

Then, the analyzer 14 selects from the second library 12 a sensitivity parameter table associated with the pattern shapes, poly gate density, and poly gate location (area) of the poly gates G1 to G4. For example, tables 1 to 4 (represented in a graphical format as shown in FIGS. 5A to 5D) respectively corresponding to poly gates G1 to G4 are selected.

Tables 1 to 4 include variation distribution models (distribution curves) stored in the fourth library 15 as a physical parameter distribution that is dependent on the layout. The physical parameter distribution stored in the fourth library 15 is used for statistical analysis of the timing characteristic (delay time), statistical analysis of the power consumption characteristic, statistical analysis of the leak characteristic, and statistical analysis of the noise characteristic.

FIGS. 5A to 5D show physical parameter distributions of transistors. Physical parameter distributions for wire resistance and wire capacitance of wire patterns are also generated in the same manner and stored in the fourth library 15.

In this case, the tables stored in the second library 12 are for variation information of the shapes of wire patterns, wire thickness, wire width, interlayer film thickness, dielectric constant, resistance, contact resistance, and wire thickness that is dependent on the density and location of the wires.

The analyzer 14 analyzes the layout pattern data stored in the first library 11 and extracts the pattern shape, density, and location of the wires for each segment. Then, the analyzer 14 selects a table corresponding to the extraction result from the second library 12 and generates variation distributions of the wire resistance and wire capacitance from the table.

Subsequently, the analyzer 14 synthesizes the variation distributions of the wire resistance and wire capacitance in the segments to generate the variation distribution of the wire resistance and wire capacitance for each net. That is, the analyzer 14 generates the physical parameter distribution. Then, the analyzer 14 stores the physical parameter distribution in the fourth library 15.

Figure 6:
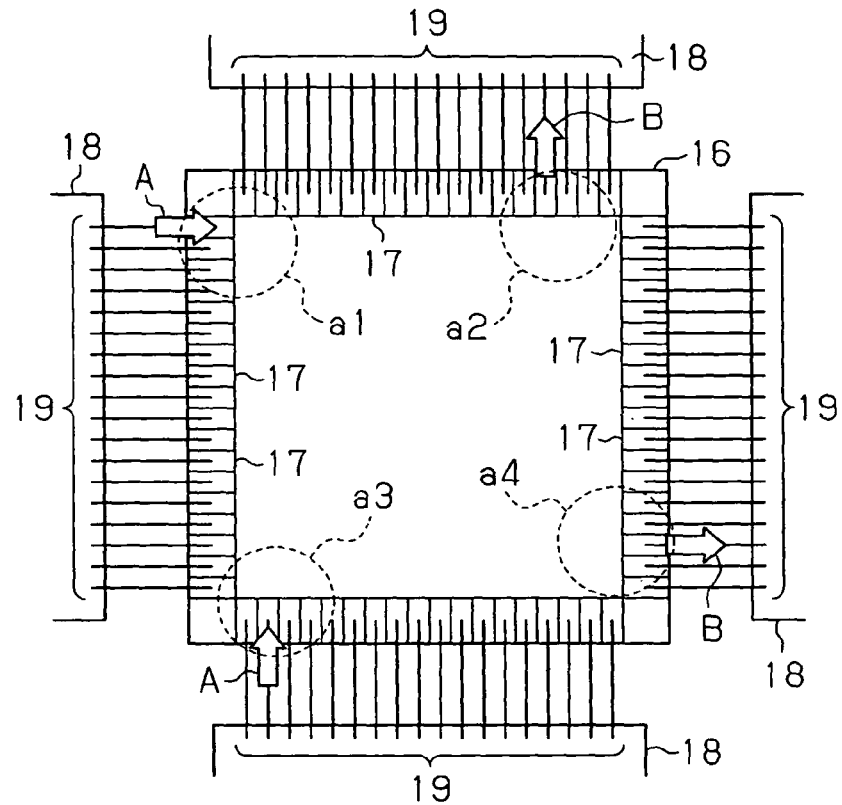
FIG. 6 is a front view showing a chip in a state in which assembly stress is produced.

Referring to FIG. 6, assembly stress acting on a chip, which is installed in a package, will now be described. When connecting pads 17 formed in the rims of the chip 16 to lead frames 18 with bonding wires 19, bonding stress (arrow A) acts on the pads 17. This changes the physical shape of the chip 16 at areas a1 and a3. Further, tensile stress (arrow B) produced by the bonding wires 19 acts on the pads 17. This changes the physical shape of the chip 16 at areas a2 and a4.

The tensile stress produced by the bonding wire 19 differs depending on the shape of the lead frames 18. Further, the stress acting in the directions of arrows A and B change the shape of the chip 16. This causes changes in the physical shape, such as the gate width and gate length of the transistors in the chip 16, and changes the transistor characteristics.

Figure 7:
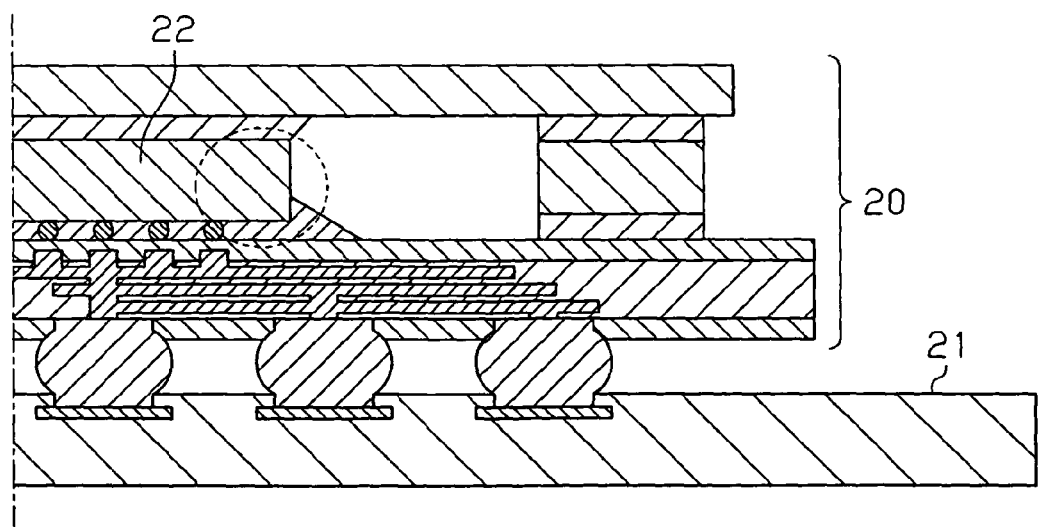
FIG. 7 is a cross-sectional view of a package in a state in which assembly stress is produced.
Figure 8:
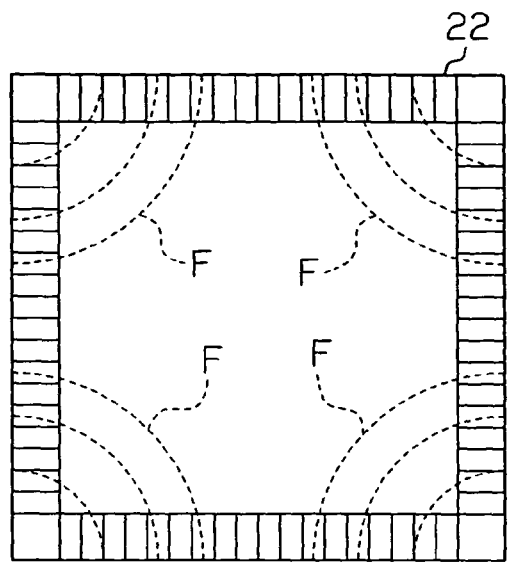
FIG. 8 is a front view showing a chip and illustrating assembly stress.

FIG. 7 shows an IC package mounted on a substrate. In this state, thermal stress acts on the chip rims and causes systematic variations in the transistor characteristics. More specifically, when soldering a package 20 to a substrate 21, thermal stress acts on a chip 22 in the package 20. As shown in FIG. 8, such stress F acts on the four corners of the chip 22 and increases at locations closer to each corner. This deforms the four corners of the chip 22 and changes the physical shape of the transistors, such as the gate width and gate length, at the corresponding positions thereby changing the transistor characteristics.

Figure 9:
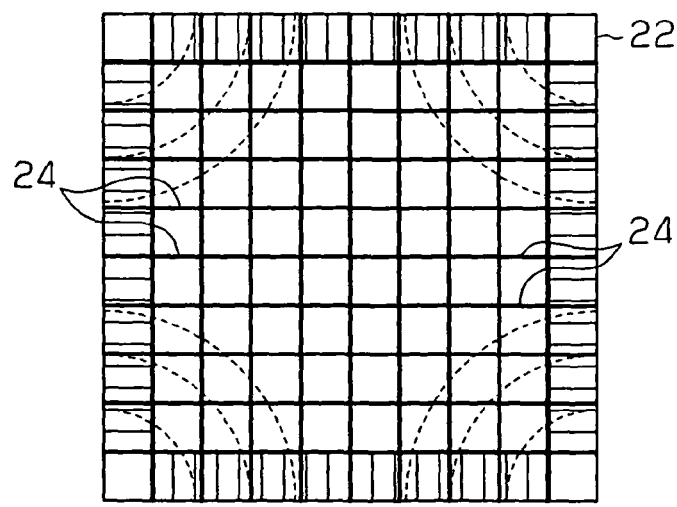
FIG. 9 is a schematic diagram showing analysis of a physical parameter distribution with assembly stress.

In such a manner, stress produced by the package shape, the substrate, and the mounting conditions changes the chip shape. To generate tables when the chip shape changes, referring to FIG. 9, the chip 22 is divided into a plurality of areas (segments) 24. The physical shape change distribution caused by the stress F during the mounting is modeled for each area 24 and stored as a table in the third library 13.

More specifically, with regard to the physical parameters for the gate length, gate width, and gate oxide film thickness, change distribution models of the physical parameters caused by stress, which is dependent on the package type and chip size, are generated for each area 24 and stored in the third library 13.

The analyzer 14 analyzes the layout pattern, selects from the third library 13 a table corresponding to a transistor in a cell or macro arranged in the corresponding area 24, and stores the table as the physical parameter distribution in the fourth library 15.

Figure 10:
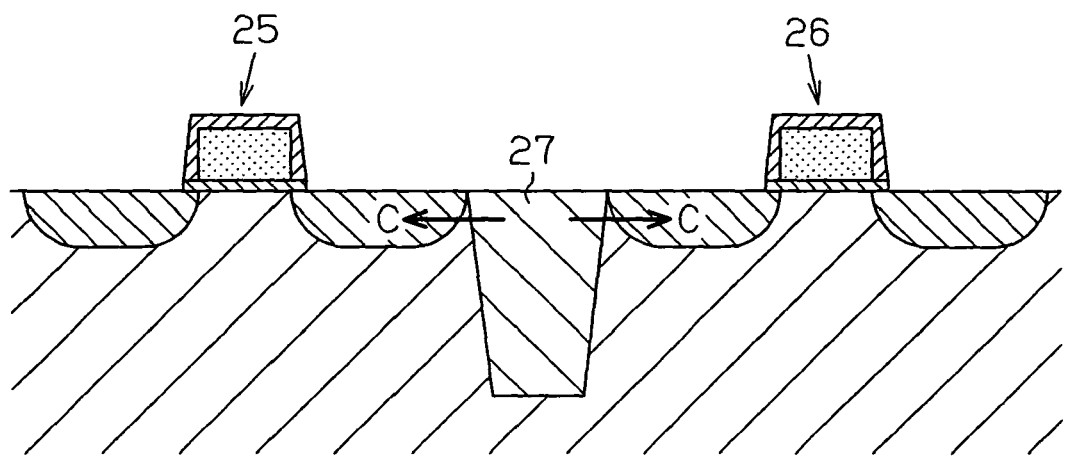
FIG. 10 is a cross-sectional diagram of a chip illustrating process stress.

FIG. 10 shows an example in which the transistor characteristic changes in a systematic manner due to the difference in thermal expansion coefficients between a transistor formation region and an insulator, which is located near the transistor formation region.

To insulate an N-channel MOS transistor formation region 25 and a P-channel MOS transistor formation region 26, a shallow trench isolation (STI) 27 is formed between the two transistor formation regions 25 and 26.

The difference in the thermal expansion coefficients between the insulator, which forms the STI 27, and the transistor formation region produces strain caused by stress acting on the transistor formation region in the direction of arrow C. This changes the transistor characteristics, which are dependent on the pattern shape, density, and locations of the transistors. (Materials and manufacturing conditions differ depending on the process technology thereby changing the source and direction of stress.)

Tables for physical parameter distributions of factors causing characteristic changes, which are dependent on the process technology, pattern shape, density, and location, are generated and stored in the second library 12.

The analyzer 14 analyzes the layout patterns, selects corresponding variation distribution models from the second library 12, and stores the models as physical parameter distributions in the fourth library 15.

The preferred embodiment has the advantages described below.

(1) Variation tables for physical parameters dependent on layouts are generated beforehand as variation distribution models. The layout patterns are analyzed and corresponding distribution models are selected. This enables the generation of physical parameter distributions for characteristic analysis. Accordingly, realistic characteristic analysis that is dependent on the layouts may be performed. Further, by designing semiconductor integrated circuits with such physical parameter distributions, margins are reduced during designing, and power consumption of semiconductor integrated circuits is lowered.

(2) Physical parameter distributions for characteristic analysis may be generated for variations in physical parameters dependent on the layout and assembly stress.

(3) Physical parameter distributions for characteristic analysis may be generated for variations in physical parameters dependent on the layout and process stress.

It should be apparent to those skilled in the art that the present invention may be embodied in many other specific forms without departing from the spirit or scope of the invention. Particularly, it should be understood that the present invention may be embodied in the following form.

In the preferred embodiment, physical parameter distributions for variations in physical parameters dependent on the layout, assembly stress, and process stress may be generated.

The present examples and embodiments are to be considered as illustrative and not restrictive, and the invention is not to be limited to the details given herein, but may be modified within the scope and equivalence of the appended claims.

What is claimed is:

1. A computer-implemented method for analyzing a layout for a semiconductor integrated circuit including a plurality of physical devices, the method comprising:

holding, in a library, systematic variation distribution tables for measured physical parameters dependent on different layouts of the semiconductor integrated circuit among physical parameters related to characteristics of the semiconductor integrated circuit in which the variation distribution tables represent variation distributions in characteristics of the semiconductor integrated circuit with respect to variations in physical parameters dependent on the layout of the semiconductor integrated circuit and the variation distribution tables are generated in accordance with shapes, density, and locations of the physical devices;

analyzing, by using a computer, a design layout pattern for the semiconductor integrated circuit, the design layout pattern to be analyzed including shapes of patterns of the physical devices, density of the patterns, and location of the patterns on a chip and selecting from the library a variation distribution table for each of the plurality of physical devices based on the result of the analysis of the design layout pattern; and generating a physical parameter distribution for the semiconductor integrated circuit based on the selected variation distribution tables respectively corresponding to the plurality of physical devices;

wherein the semiconductor integrated circuit is formed by the chip including a plurality of areas; and the variation distribution tables for the measured physical parameters are dependent on the layout and assembly stress of the semiconductor integrated circuit and are generated for each area of the chip, the assembly stress representing external stress acting on the semiconductor integrated circuit when assembling the semiconductor integrated circuit, and different assembly stress is exerted on the physical devices dependent on locations of the physical devices in the semiconductor integrated circuit and contents of the assembling.

2. A computer-implemented method for analyzing a layout for a semiconductor integrated circuit including a plurality of physical devices, the method comprising:

holding, in a library, systematic variation distribution tables for measured physical parameters dependent on different layouts and assembly stress of the semiconductor integrated circuit among physical parameters related to characteristics of the semiconductor integrated circuit in which the variation distribution tables represent variation distributions in characteristics of the semiconductor integrated circuit with respect to variations in physical parameters dependent on the layout and assembly stress the semiconductor integrated circuit, the assembly stress representing external stress acting on the semiconductor integrated circuit when assembling the semiconductor integrated circuit, and different assembly stress is exerted on the physical devices dependent on locations of the physical devices in the semiconductor integrated circuit and contents of the assembling;

analyzing, by using a computer, a design layout pattern for the semiconductor integrated circuit, the design layout pattern to be analyzed including shapes of patterns of the physical devices, density of the patterns, and location of the patterns on a chip and selecting from the library a variation distribution table for each of the plurality of physical devices based on the result of the analysis of the design layout pattern; and generating a physical parameter distribution for the semiconductor integrated circuit based on the selected variation distribution tables respectively corresponding to the plurality of physical devices.

3. The method according to claim 2, wherein:

the semiconductor integrated circuit is formed by the chip including a plurality of areas; and the variation distribution tables for the measured physical parameters are variation distribution tables for physical parameters dependent on the layout and the assembly stress of the semiconductor integrated circuit and are generated for each area of the chip.

4. The method according to claim 2, wherein the assembly stress includes bonding stress and thermal stress.

5. A computer-implemented method for analyzing a layout for a semiconductor integrated circuit including a plurality of physical devices, the method comprising:

holding, in a library, systematic variation distribution tables for measured physical parameters dependent on different layouts and process stress of the semiconductor integrated circuit among physical parameters related to characteristics of the semiconductor integrated circuit in which the variation distribution tables represent variation distributions in characteristics of the semiconductor integrated circuit with respect to variations in physical parameters dependent on the layout and process stress of the semiconductor integrated circuit, the process stress representing stress acting on the semiconductor integrated circuit and causing strain in the semiconductor integrated circuit dependent on large-scale integrated circuit (LSI) process technology;

analyzing, by using a computer, a design layout pattern for the semiconductor integrated circuit, the design layout pattern to be analyzed including shapes of patterns of the physical devices, density of the patterns, and location of the patterns on a chip and selecting from the library a variation distribution table corresponding to location of the physical device on the chip for each of the plurality of physical devices based on the result of the analysis of the design layout pattern; and generating a physical parameter distribution for the semiconductor integrated circuit based on the selected variation distribution tables respectively corresponding to the plurality of physical devices.

6. A layout analysis apparatus for analyzing a layout for a semiconductor integrated circuit including a plurality of physical devices, the apparatus comprising:

a library for holding systematic variation distribution tables for measured physical parameters dependent on different layouts and assembly stress of the semiconductor integrated circuit among physical parameters related to characteristics of the semiconductor integrated circuit in which the variation distribution tables represent variation distributions in characteristics of the semiconductor integrated circuit with respect to variations in physical parameters dependent on the layout and assembly stress of the semiconductor integrated circuit, the assembly stress representing external stress acting on the semiconductor integrated circuit when assembling the semiconductor integrated circuit, and different assembly stress is exerted on the physical devices dependent on locations of the physical devices in the semiconductor integrated circuit and contents of the assembling; and an analyzer for analyzing a design layout pattern for the semiconductor integrated circuit, the design layout pattern to be analyzed including shapes of patterns of the physical devices, density of the patterns, and location of the patterns on a chip, selecting and extracting from the library a variation distribution table for each of the plurality of physical devices based on the result of the analysis of the design layout pattern, and generating a physical parameter distribution for the semiconductor integrated circuit based on the extracted variation distribution tables respectively corresponding to the plurality of physical devices.

7. The layout analysis apparatus according to claim 6, wherein the assembly stress includes bonding stress and thermal stress.

8. A layout analysis apparatus for analyzing a layout for a semiconductor integrated circuit including a plurality of physical devices, the apparatus comprising:

a library for holding systematic variation distribution tables for measured physical parameters dependent on different layouts and process stress of the semiconductor integrated circuit among physical parameters related with characteristics of the semiconductor integrated circuit in which the variation distribution tables represent variation distributions in characteristics of the semiconductor integrated circuit with respect to variations in physical parameters dependent on the layout and process stress of the semiconductor integrated circuit, the process stress representing stress acting on the semiconductor integrated circuit and causing strain in the semiconductor integrated circuit dependent on large-scale integrated circuit (LSI) process technology; and an analyzer for analyzing a design layout pattern for the semiconductor integrated circuit including shapes of patterns of the physical devices, density of the patterns, and location of the patterns on a chip, selecting and extracting from the library a variation distribution table corresponding to location of the physical device on the chip for each of the plurality of physical devices based on the result of the analysis of the design layout pattern, and generating a physical parameter distribution for the semiconductor integrated circuit based on the extracted variation distribution tables respectively corresponding to the plurality of physical devices.

* * * * *